US008110414B2

(12) United States Patent
Cathey, Jr. et al.

(10) Patent No.: US 8,110,414 B2
(45) Date of Patent: Feb. 7, 2012

(54) FORMING INTEGRATED CIRCUIT DEVICES WITH METAL-INSULATOR-METAL CAPACITORS USING SELECTIVE ETCH OF TOP ELECTRODES

(75) Inventors: Marshall O. Cathey, Jr., Denison, TX (US); Pushpa Mahalingam, Richardson, TX (US); Weidong Tian, Dallas, TX (US); David C. Guiling, Garland, FL (US); Xinfen Chen, Plano, TX (US); Binghua Hu, Plano, TX (US); Sopa Chevacharoenkul, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 247 days.

(21) Appl. No.: 12/433,042

(22) Filed: Apr. 30, 2009

(65) Prior Publication Data

US 2010/0276783 A1    Nov. 4, 2010

(51) Int. Cl.
*H01L 31/26* (2006.01)
*H01L 21/66* (2006.01)
(52) U.S. Cl. .................. 438/14; 438/396; 257/532
(58) Field of Classification Search .............. 438/14, 438/396; 257/532, E21.529, E27.071
See application file for complete search history.

(56) References Cited

U.S. PATENT DOCUMENTS

| 7,719,526 | B2 * | 5/2010 | Kimura et al. | 345/204 |
| 2004/0169216 | A1 * | 9/2004 | Kiyotoshi | 257/296 |
| 2004/0180508 | A1 * | 9/2004 | Park | 438/393 |
| 2007/0075395 | A1 * | 4/2007 | Ahn | 257/516 |
| 2010/0091424 | A1 * | 4/2010 | Loh et al. | 361/301.4 |

FOREIGN PATENT DOCUMENTS

KR    20040073110 A    8/2004

* cited by examiner

*Primary Examiner* — Phuc Dang
(74) *Attorney, Agent, or Firm* — John R. Pessertto; W. James Brady; Frederick J. Telecky, Jr.

(57) ABSTRACT

A method of forming integrated circuits (IC) having at least one metal insulator metal (MIM) capacitor. A bottom electrode is formed on a predetermined region of a semiconductor surface of a substrate. At least one dielectric layer including silicon is formed on the bottom electrode, wherein a thickness of the dielectric layer is <1,000 A. A top electrode layer is formed on the dielectric layer. A patterned masking layer is formed on the top electrode layer. Etching using dry-etching at least in part is used to etch the top electrode layer outside the patterned masking layer to reach the dielectric layer, which removes ≦100 A of the thickness of the dielectric layer. The dry etch process includes using a first halogen comprising gas, a second halogen comprising gas that comprises fluorine, and a carrier gas.

3 Claims, 2 Drawing Sheets

FORMING INTEGRATED CIRCUIT DEVICES WITH METAL-INSULATOR-METAL CAPACITORS USING SELECTIVE ETCH OF TOP ELECTRODES

FIELD OF THE INVENTION

Embodiments of the invention are related to integrated circuits (ICs) and IC fabrication, and more particularly to ICs including metal-insulator-metal (MIM) capacitors, and fabrication methods thereof.

BACKGROUND

One type of passive component that is increasingly incorporated into many IC designs is a MIM capacitor, which typically incorporates a stacked arrangement of materials that comprises top and bottom electrically conductive electrodes, and an intermediate insulator layer incorporating one or more dielectric layers. Typically, a MIM capacitor is fabricated between metal interconnect layers in an IC (e.g., between the M2 and M3 layer), which locates the MIM capacitor away from the underlying semiconductor surface, such that parasitic capacitance effects with the semiconductor surface of the substrate are minimized.

Given the ever-present desire to reduce the sizes of components in an IC, it is desirable to minimize the circuit area occupied by MIM capacitors. To provide a desired capacitance from a MIM capacitor within a smaller circuit area, an increase in the capacitance density of the capacitor (which based upon present design rules is typically expressed in terms of femtofarads per square micrometer ($fF/\mu m^2$)) is generally relied on. Conventional approaches for increasing MIM capacitor capacitance density have typically focused upon using high dielectric constant (high-k) dielectric materials in the dielectric layer of the MIM capacitor, decreasing the dielectric layer thickness and/or utilizing capacitor geometries that increase the perimeter (which increases fringe and lateral capacitance effects). High-k dielectric constant materials such as tantalum pentoxide, tantalum oxynitride, silicon nitride, barium strontium titanate (BST), lead zirconium titanate, and hafnium oxide have been used in conventional MIM capacitor designs. The dielectric thickness can be in a range of approximately 200 to 500 A, with the minimum thickness generally selected to limit short circuits or leakage between the top and bottom electrodes of the MIM capacitor.

The MIM capacitor has low resistivity and no parasitic capacitance caused by depletion (assuming metal electrodes, as opposed to polysilicon electrodes), so it is widely used in high performance semiconductor devices that benefit from a high Q value. MIM capacitors are often utilized, for example, in high frequency (e.g., RF) telecommunications applications, such as in cellular phones and other wireless devices, as well as other telecommunications products. Often, MIM capacitors are used to provide functions such as decoupling with a power supply, analog functions such as analog-to-digital conversions (ADC) and filtering, and termination of transmission lines. Decoupling applications generally have relatively loose leakage requirements, whereas analog applications, such as for ADC's, typically require closer capacitor matching (e.g., between neighboring capacitors), and relatively good voltage linearity. For analog technology nodes needing high density, high precision TiN—Al or TiN/Ti/TiN—Al interconnect metal capacitors have been used that have a top electrode thickness generally between 1,500 and 2,000 A and a dielectric thickness of about 200 to 400 A. For such capacitors, the dielectric can comprise $Si_3N_4$ (silicon nitride) or SiON (silicon oxynitride), which can be used as a non-sacrificial layer in the regions outside the MIM capacitor to function as an anti-reflective coating (ARC) for subsequent lithography. In one embodiment, SiON may be interposed between silicon oxide layers as silicon oxide (capping layer)/SiON/silicon oxide (bottom layer).

Processing for defining such MIM capacitors generally involves etching of the top electrode layer and attempting to preserve the underlying dielectric layer, such as in order to serve as an ARC layer. As a consequence, a highly selective top electrode: dielectric etch process is generally needed. Known reasonably selective top electrode etch chemistries generally comprise at least in part wet etching, which necessitates the use of hard masking layers (e.g., silicon nitride), which adds to process complexity, cycle time and cost as compared to soft masking (resist) layers which can be used with dry (e.g., plasma) etch processes.

SUMMARY

Embodiments of the inventions describe new semiconductor etch processes that comprise at least in part dry (e.g., plasma) etching of the top electrode of MIM capacitors, and ICs therefrom. Such processes generally provide high selectivity to the underlying dielectric (e.g., >8, such as ≧10), which is generally a thin dielectric (e.g., <1,000 A, typically <400A) and improved capacitor critical dimension (CD) control. For embodiments of the invention where the top electrode layer etch is exclusively dry-etched, such embodiments generally allow simplified process integration by eliminating the need for the hard mask (e.g., silicon nitride) needed for top electrode layer wet etch processing.

Embodiments of the invention enable formation of high precision, high density MIM capacitors, and generally also provide a significant circuit yield improvement as compared to hard mask/wet etch comprising top electrode etch processes. High precision obtained by embodiments of the invention generally includes improved CD control and hence improved capacitor matching (e.g., ≦250 ppm-μm). Moreover, the top electrode etch rate for dry etches according to embodiments of the invention is generally high, typically being at least 1,000 A/min, making methods according to embodiments of the invention well adapted for high volume IC manufacturing.

DETAILED DESCRIPTION

Figure 1:
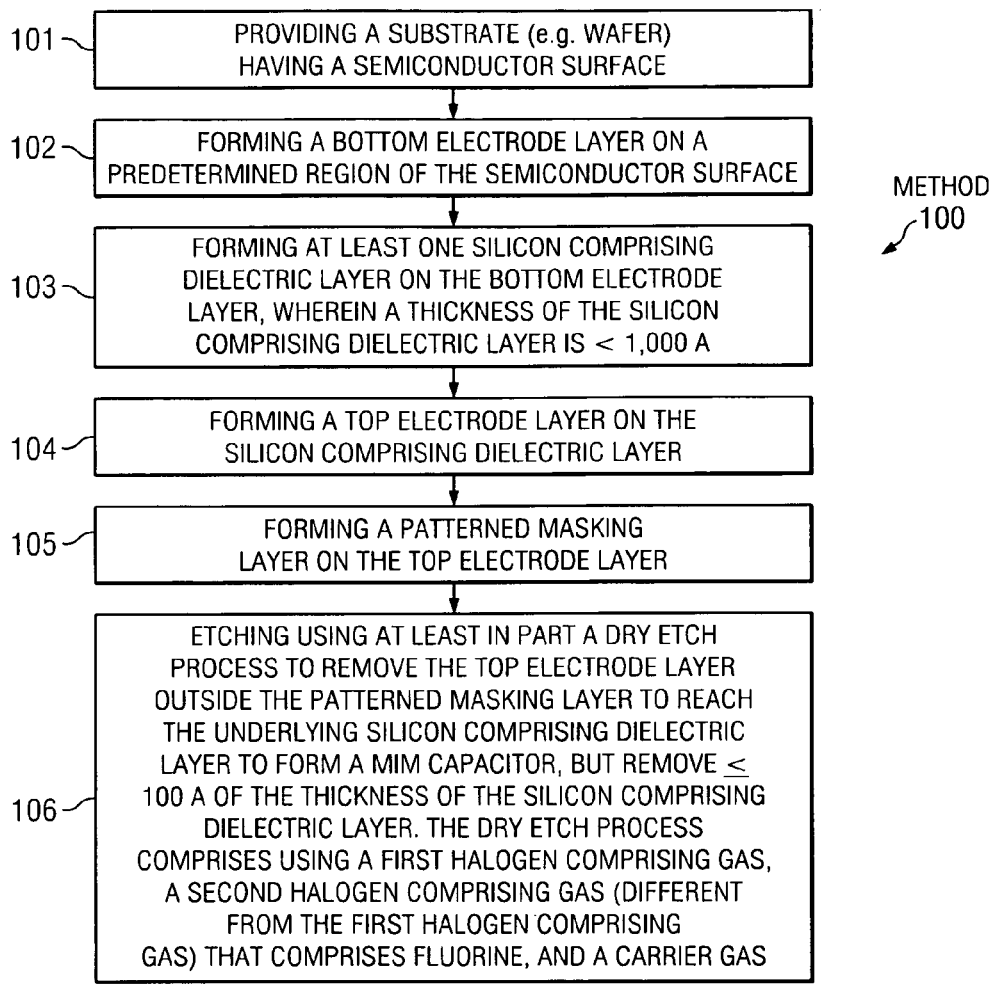
FIG. 1 shows steps in an exemplary method of forming an integrated circuit (IC) having at least MIM capacitor, according an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

FIG. 1 shows steps in a method 100 of forming an IC having at least one MIM capacitor, according an embodiment of the invention. Step 101 comprises providing a substrate (e.g., wafer) having a semiconductor surface. The substrate can generally be any substrate, such as bulk silicon wafer with or without an epitaxial layer, silicon on insulator (SOI), or other substrate. Step 102 comprises forming a bottom electrode layer on a predetermined region of the semiconductor surface. The bottom electrode layer can comprise a variety of electrically conductive materials, including highly doped polysilicon, refractory metal comprising (e.g., TiW), or an interconnect metal such as aluminum comprising (Al with around 1% Cu) or copper comprising (e.g., copper damascene).

Step 103 comprises forming at least one silicon comprising dielectric layer on the bottom electrode layer, wherein a thickness of the silicon comprising dielectric layer is <1,000 A. In a typical embodiment, the dielectric thickness is thinner than 1,000 A, such as 150 A to 400 A, to raise the capacitance/area of the MIM capacitor.

The silicon comprising dielectric layer is generally spun on (e.g., hydrogen silsesquioxane (HSQ)) or deposited (e.g., by LPCVD or PECVD). The silicon comprising dielectric layer can comprise silicon oxide (e.g., $SiO_2$), $Si_3N_4$ or SiON. In one embodiment the silicon comprising dielectric layer comprises a dielectric stack including a plurality of different dielectric layers. The dielectric stack can include an ARC layer, such as SiON or $Si_3N_4$. As known in the art, an ARC layer/coating is a type of optical coating generally formed on the front (circuit) side surface of the wafer to reduce reflections during subsequent photolithography processing. The reduction in reflections improves contrast of the image formed by reducing stray light, thereby improving alignment to an underlying layer.

In one particular embodiment, the dielectric stack is 200 A to 300 A thick and comprises silicon dioxide/SiON/silicon dioxide, such as around 50 A silicon dioxide, 150 A SiON, and 50 A silicon dioxide. In such a stack arrangement, the silicon dioxide layers help prevent the SiON layer from being exposed to air and thus reacting.

Step 104 comprises forming a top electrode layer on the dielectric layer having a top electrode thickness. The top electrode layer can comprise a variety of electrically conductive materials, including highly doped polysilicon, refractory metals (e.g., W, Ta, or Ti), or interconnect metals such as aluminum comprising (Al with around 1% Cu) or copper comprising (e.g., copper damascene). In one embodiment, a thickness of the top electrode layer is 1,500 A to 2,500 A.

Step 105 comprises forming a patterned masking layer on the metal comprising top electrode layer. The masking layer can comprise a hard masking layer, such as $Si_3N_4$ or SiON, or a soft masking layer (e.g., photoresist). The soft masking layer is generally used when step 106 described below comprises exclusively dry-etching (no wet etch portion) to define the top electrode layer. However, embodiments of the invention can include a dry-etch in part and a wet etch in part, such as a dry-etch portion followed by a wet etch portion. In the dry-etch and wet etch embodiment, the masking layer generally comprises a hard masking layer.

Step 106 comprises etching using a dry-etch process at least in part to remove the top electrode layer outside the patterned masking layer to reach the underlying silicon comprising dielectric layer, wherein ≦100 A of the dielectric layer is removed. The dry-etching comprises using a first halogen comprising gas, a second halogen comprising gas (different from the first halogen comprising gas) that comprises fluorine, and a carrier gas (e.g., for etch rate uniformity) to form the MIM capacitor. The dry-etching can generally be performed in a variety of plasma processing apparatus, including, but not limited to, those for plasma etching, reactive ion etching, electron cyclotron resonance etching, magnetically enhanced reactive ion etching. The etch process generally comprises flowing the respective etchant source gases into an etch chamber. A plasma is generated using RF power out of the etchant source gases within the plasma processing chamber to cause etching of the top electrode layer.

The first halogen comprising gas can comprise a diatomic halogen gas, such as $Cl_2$ or $Br_2$. The second halogen comprising gas comprises F and can comprise a carbon-fluoride (CF)-based gas such as $CF_4$ or a CHF-based gas such as $CHF_3$ (fluoroform) or $CH_2F_2$, or other fluorine comprising gases such as $SF_6$. The carrier gas can comprise a noble gas, such as Ar, He or Ne. The carrier gas flow is generally limited to about 20 sccm since higher carrier gas flows with the RF power provided have been found by the Present Inventors to generally result in physical etching due to ion bombardment instead of the generally desired chemical etch process.

The etch gas mixture is typically exclusive of oxygen. In some embodiments of the invention, the carrier gas comprises a noble gas, a flow of the first halogen comprising gas is 80 to 100 sccm, a flow of the second halogen comprising gas is 5-15 sccm; a flow of the noble gas is 5 to 20 sccm, a chamber pressure is 10-20 mtorr, an RF Power is 700-900 W, and a temperature is 40 to 60° C. For example, in one specific embodiment, the first halogen comprising gas can comprise $Cl_2$, the second halogen comprising gas can comprise $CHF_3$, and the noble gas can comprise Ar, with the etch gas mixture including no other gases.

In one embodiment of the invention, the metal comprising top electrode layer comprises TiN and the dry-etch rate of the TiN is at least 1,200 A/min and an etch rate selectivity of the TiN to the silicon comprising dielectric layer is at least 8:1. In this embodiment, the thickness of the silicon comprising dielectric layer can be from 150 A to 400 A, the patterned masking layer can comprise photoresist and the dry-etching (step 106) can remove all of the top electrode thickness outside the patterned masking layer and have sufficient etch selectivity and endpoint detection to remove no more than 75 A of the thickness of the silicon comprising dielectric layer (e.g., silicon oxide), such as <50 A. Since most of the silicon comprising dielectric layer is generally preserved by top electrode etch processes according to embodiments of the invention, in the case the bottom electrode layer comprises aluminum, fluorine from the second halogen comprising gas cannot generally damage the underlying aluminum comprising layer by forming non-volatile aluminum fluoride. Aluminum fluoride formation is known in the art to plague conventional top electrode etch processes when aluminum is the bottom electrode layer and the dielectric is thin (e.g., <400 A), due to conventional top electrode/dielectric etch selectivities of ≦6:1.

Figure 2:
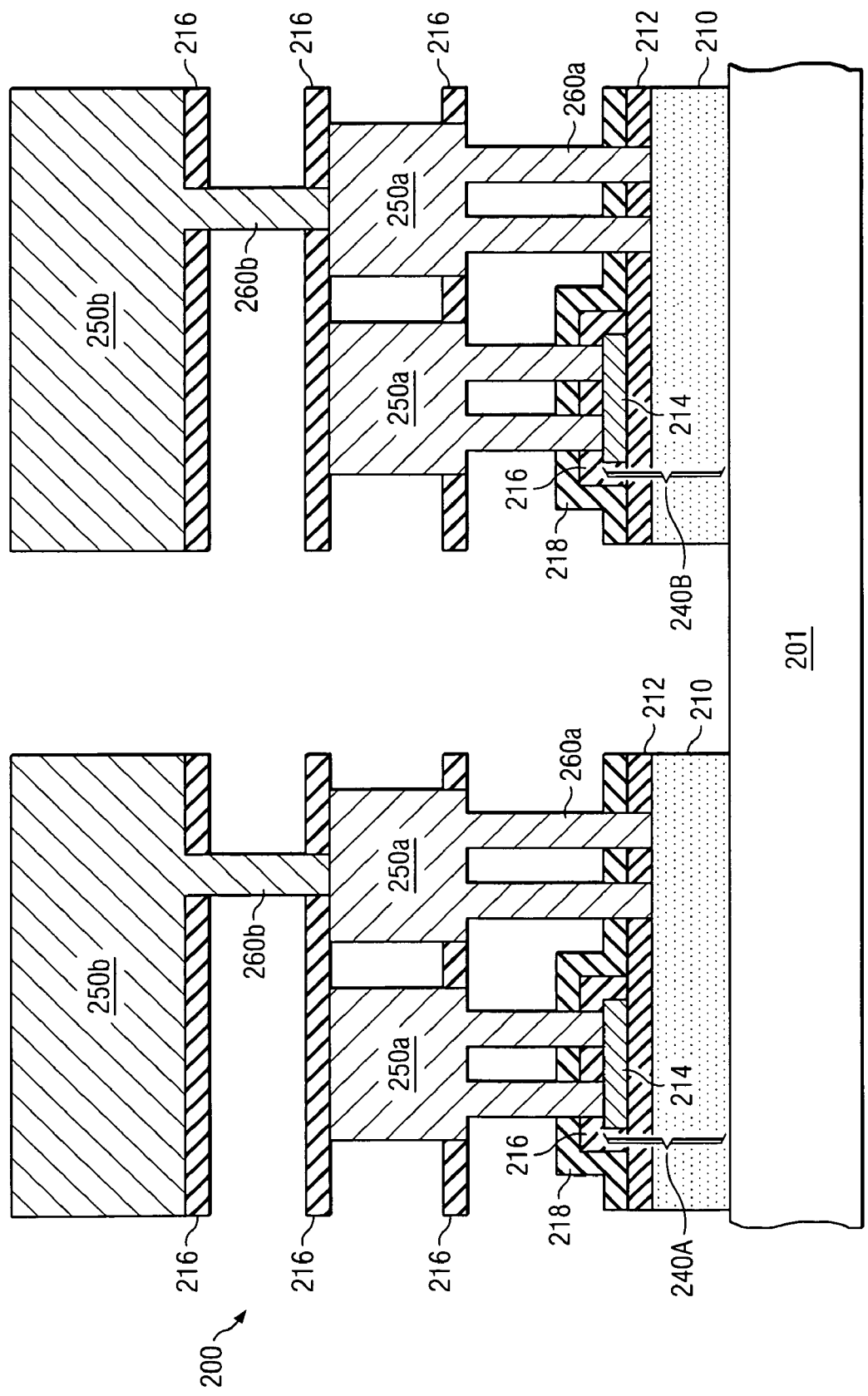
FIG. 2 is a cross-sectional view showing an IC having a plurality of MIM capacitors, according to an embodiment of the invention.

FIG. 2 is a cross-sectional view showing an IC 200 comprising a substrate having a semiconductor surface 201, and a first and a second MIM capacitor 240A and 240B (collectively referred to herein as MIM capacitor 240) formed on the semiconductor surface 201, according to an embodiment of the invention. A capacitor insulation layer 212 (e.g., dielectric layer comprising silicon oxide) and an upper conductor layer 214 (capacitor top electrode layer) are formed on a lower metal or heavily doped polysilicon comprising layer 210 (capacitor bottom electrode). Capacitor dielectric layer 212 is <1,000 A thick, and is generally 150 A to 400 A thick. In FIG. 2, reference numerals 250a and 250b indicate overlying metal interconnect layers, and reference numerals 260a and 260b indicate via contacts between the metal interconnect layers. In addition, reference numerals 216 and 218 indicate dielectric layers. In FIG. 2, bulk interlayer dielectric layers (between the metal layers) are omitted for convenience of description.

When the top electrode layer 214 is etched, for example a titanium nitride (TiN) or TiN/Ti/TiN layer, a partial loss of the dielectric layer 212 generally occurs, with the loss being a function of the selectivity of the top electrode etch process. Since the etch selectivity generally provided by embodiments of the invention is at least 8:1, such as ≧10:1, coupled with end point detection, the amount of the dielectric layer 212 thickness etched (lost) during the etching of the top electrode layer is ≦100 A, generally <75 A, and typically is <50 A. Accordingly, the thickness of the dielectric layer 212 is shown in FIG. 2 as being essentially the same both under the top electrode layer 214 of MIM capacitor 240 (where it was not exposed to the top electrode etch process) and regions outside the MIM capacitor 240 (where it was exposed to the top electrode etch process).

For example, if the top electrode etch processes removes 50 A of dielectric layer 212 and dielectric layer 212 is 250 A thick in MIM capacitor 240, the thickness of the dielectric layer 212 in regions outside the MIM capacitor 240 is generally ≧80% of the thickness of the dielectric layer 212 in MIM capacitor 240. Particularly in embodiments where the dielectric layer 212 includes an ARC layer, such as SiON (e.g., silicon oxide/SiON/silicon oxide) as described above, the preservation of the ARC layer portion of dielectric layer 212 is helpful for improving lithographic alignment for the subsequent metal patterning process.

Dielectric layer 212 in regions outside the MIM capacitor 240 is generally a non-sacrificial layer, and is thus present in the completed (final) IC. Accordingly, final ICs having MIM capacitors formed using embodiments of the invention have distinguishing features that can differentiate such ICs from ICs having conventional MIM capacitors formed using conventional top plate etch processes. For example, an IC having at least one MIM capacitor according to an embodiment of the invention can comprise a thickness of the silicon comprising dielectric layer 212 in the MIM capacitor 240 of between 150 A to 400 A and a thickness of the silicon comprising dielectric layer 212 outside the MIM capacitor 240 being ≦100 thinner, such as ≦75 A thinner, and typically <50 A thinner, as compared to the thickness of the silicon comprising dielectric layer 212 in the MIM capacitor 240.

Particularly for ICs according to embodiments of the invention formed using a top electrode layer etch process that is exclusively a dry-etch process, due to the anisotropic nature of dry-etching and the ability the generally form vertical or near vertical walls, there will be generally no measurable undercut (e.g., ≦20 A) of the dielectric layer 212 relative to the top electrode layer 214. In contrast, due to the isotropic nature of wet etching, the wet etching in conventional top electrode layer etch processes results in a lateral undercut of the dielectric layer relative to the top electrode layer.

The extent of the lateral undercut is generally approximately the same as the amount of the dielectric layer removed outside the MIM capacitor area, such as ≧200 A, but is known to vary, for example, 150 A to 250 A for a nominal 200 A undercut process. The wet etch generated lateral undercut of the top electrode layer for conventional processing thus impacts the effective CD of the MIM capacitors on the IC, which has implications on MIM capacitor performance (low voltage coefficients), precision and matching. As shown in the Examples below, MIM capacitors according to embodiments have demonstrated ≦250 ppm-μm matching, typically ≦200 ppm-μm, as compared to 300 to 400 ppm-μm for MIM capacitors having the same geometries formed using conventional top electrode layer etch processes which include wet etching.

As described above, embodiments of the invention generally provide highly selective top electrode to silicon comprising dielectric (e.g., silicon oxide) etch methods with high top electrode layer etch rates (e.g., 1,800 to 3,000 A/min) making it useful for high-volume production, and also generally eliminating the need for a hardmask layer, such as silicon nitride. The gas chemistry described herein with the flow ranges provided can enable highly selective top electrode to dielectric layer etching, such as ≧10:1 and the ability to limit etch of the silicon comprising dielectric outside the MIM capacitor to ≦100 A, such as <75 A, and generally ≦50A, as well as improved capacitor profiles and resulting improved MIM matching over conventional wet etch comprising top electrode layer etch processes (e.g., dry+wet etch processes). As described above, wet etching of the top electrode layer results in lateral undercut of the dielectric layer under the top plate, thereby impacting the effective CD of the MIM capacitor which adversely affects MIM capacitor performance, precision and matching. As described above, methods according to embodiments of the invention are generally adaptable to generally be used in any of the known plasma processing apparatuses including those for plasma etching, reactive ion etching, electron cyclotron resonance etching, magnetically enhanced reactive ion etching.

Particularly when the hardmask is removed from the top electrode etch process, a significant improvement in inline defects has been found to be provided. The Present Inventors have found a 7% yield improvement for analog ICs primarily driven by a significantly improved yield in the edge zone of the wafer. Moreover, etch methods according to embodiments of the invention can eliminate chronic reliability issues by eliminating "blue eye defect" which as known in the art is caused by wet etchant chemical flow through pinhole defects in the metal stack during wet etching of the top electrode layer. Etch methods according to embodiments of the invention have demonstrated production of reliable capacitors in a consistent manner with very high yields and good matching, as described in the Examples below.

EXAMPLES

Embodiments of the present invention are further illustrated by the following specific Examples, which should not be construed as limiting the scope or content of embodiments of the invention in any way.

Example 1

A MIM capacitor was formed on a bulk silicon test wafer and the top electrode was defined by an Applied Materials (Santa Clara, Calif.) DPS™ etcher. The bottom electrode layer of the MIM capacitor comprised aluminum, the dielectric comprised a 250 A thick dielectric stack comprising silicon oxide/SiON/silicon oxide, and the top electrode layer comprised 1,800 A of TiN. The etch gases comprised $Cl_2$=90 sccm, Ar=10 sccm, $CHF_3$=10 sccm, and other etch parameters comprised a chamber pressure=15 mtorr, cathode 45° C., backside He pressure=10 T, power 25 W bias, and an 800 W RF source. The TiN:oxide selectivity was found to be ≧10:1 and the TiN etch rate was found to be about 1,800 A/min. A 365 nm wavelength (near ultra-violet (NUV)) was used to allow the TiN etch to endpoint on the thin silicon oxide layer.

Example 2

Figure 3:
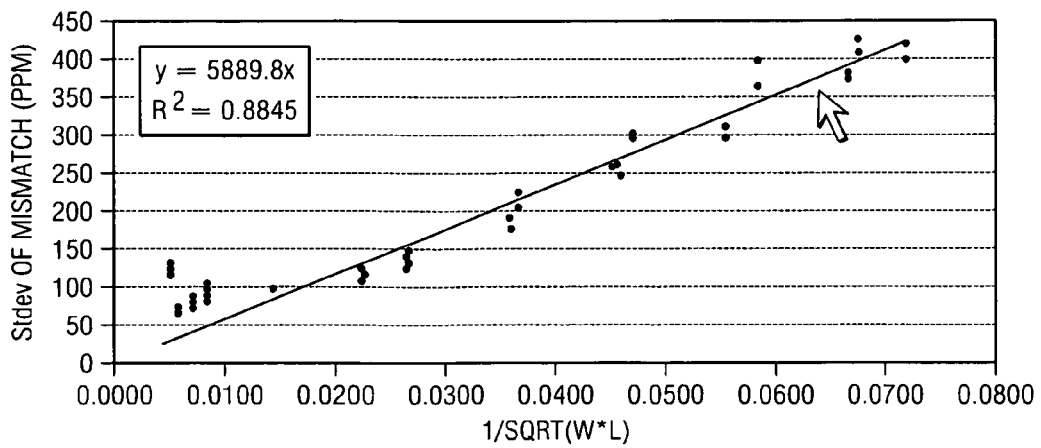
FIG. 3 shows MIM capacitor match data demonstrating MIM capacitor matching of about 200 ppm-μm for MIM capacitors having W=L=37 μm, according to an embodiment of the invention.

An IC having a plurality of MIM capacitors was formed having the MIM capacitor structure and using a dry-etch only top electrode layer etch process as described immediately above. FIG. 3 shows MIM capacitor match data demonstrating capacitor matching of about 200 ppm-μm for MIM capacitors having W=L=37 μm, according to an embodiment of the invention. In comparison, for the same geometry, MIM capacitors formed using a conventional dry+wet top electrode layer etch were found to provide matching of 300-400 ppm-μm. The significant improvement in MIM capacitor matching for MIM capacitors according to embodiments of the invention is provided primarily because the dry-etch controls the CD of the MIM capacitors more tightly as compared to conventional dry+wet etch combination as described above.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method of forming integrated circuit (IC) devices having at least one Metal Insulator Metal (MIM) capacitor, comprising:
   providing a substrate having a semiconductor surface;
   forming a bottom electrode layer on a predetermined region of said semiconductor surface;

forming a dielectric stack comprising capping silicon oxide/silicon oxynitride/bottom silicon oxide, wherein a thickness of said dielectric stack is between 150 and 400 angstroms;

forming a top electrode layer comprising Ti on said dielectric stack, forming a patterned soft masking layer on said top electrode layer;

etching said top electrode layer with exclusively a dry etch process outside said patterned soft masking layer using a first halogen comprising gas comprising $Cl_2$, a second halogen comprising gas that comprises fluorine, and a carrier gas comprising a noble gas to reach said dielectric stack, wherein said dry-etching provides an etch selectivity for said top electrode layer to said capping silicon oxide of $\geq 8:1$ and said dry-etching removes $\leq 75$ A of said capping silicon oxide.

2. The method of claim 1, wherein said bottom electrode layer comprises a metal interconnect layer on said IC.

3. The method of claim 1, wherein at least a portion of said silicon comprising dielectric layer comprises an anti-reflective coating (ARC) layer.

* * * * *